(12) United States Patent
Xiang et al.

(10) Patent No.: US 10,692,424 B2
(45) Date of Patent: Jun. 23, 2020

(54) ORGANIC ELECTROLUMINESCENT DISPLAY PANEL, DRIVING METHOD THEREOF AND DISPLAY DEVICE

(71) Applicant: SHANGHAI TIANMA AM-OLED CO., LTD., Shanghai (CN)

(72) Inventors: Dongxu Xiang, Shanghai (CN); Yue Li, Shanghai (CN); Zeyuan Chen, Shanghai (CN); Xiangzi Kong, Shanghai (CN); Xingyao Zhou, Shanghai (CN); Chuanli Leng, Shanghai (CN); Yuan Li, Shanghai (CN)

(73) Assignee: SHANGHAI TIANMA AM-OLED CO., LTD., Shanghai (CN)

( * ) Notice: Subject to any disclaimer, the term of this patent is extended or adjusted under 35 U.S.C. 154(b) by 7 days.

(21) Appl. No.: 15/862,618

(22) Filed: Jan. 4, 2018

(65) Prior Publication Data
US 2018/0130406 A1    May 10, 2018

(30) Foreign Application Priority Data
Aug. 25, 2017    (CN) .......................... 2017 1 0742194

(51) Int. Cl.
*G09G 3/3208*    (2016.01)

(52) U.S. Cl.
CPC ... *G09G 3/3208* (2013.01); *G09G 2310/0264* (2013.01); *G09G 2320/0653* (2013.01)

(58) Field of Classification Search
CPC ......... G09G 3/3208; G09G 2310/0264; G09G 2320/0653
See application file for complete search history.

(56) References Cited

U.S. PATENT DOCUMENTS

| | | | |
|---|---|---|---|
| 8,970,567 B2 | 3/2015 | Ka | |
| 2004/0090447 A1* | 5/2004 | Wang | G09G 5/006 345/698 |
| 2004/0125054 A1* | 7/2004 | Chan | G09G 3/3208 345/82 |
| 2009/0201231 A1* | 8/2009 | Takahara | G09G 3/3233 345/76 |
| 2016/0261815 A1* | 9/2016 | Shiohara | H04N 5/23293 |
| 2017/0200412 A1* | 7/2017 | Gu | G09G 3/3266 |

* cited by examiner

*Primary Examiner* — Patrick N Edouard
*Assistant Examiner* — Eboni N Giles

(57) ABSTRACT

The disclosure discloses an organic electroluminescent display panel, a driving method thereof and a display device, where the dimming mode is taken to drive and each frame of scanning time is divided into the display area scanning time and the front-back porch time. Where each line of pixel circuits located in the display area of the organic electroluminescent display panel are scanned during the display area scanning time; and the drive circuit is adjusted during the front-back porch time. Where the front-back porch time is less than the display area scanning time, and the front-back porch time is the common multiple of the respective clock signal cycles in the gate drive circuit of the organic electroluminescent display panel.

17 Claims, 16 Drawing Sheets

ORGANIC ELECTROLUMINESCENT DISPLAY PANEL, DRIVING METHOD THEREOF AND DISPLAY DEVICE

This application claims the benefit of Chinese Patent Application No. CN 201710742194.6, filed with the Chinese Patent Office on Aug. 25, 2017, which is hereby incorporated by reference in its entirety.

FIELD OF INVENTION

The present disclosure relates to the field of computer technologies and particularly to an organic electroluminescent display panel, a driving method thereof and a display device.

BACKGROUND

At present, in the display devices such as mobile phone products using the organic electroluminescent display panel, in order to eliminate the ghosting and speed up the response time, the dimming mode is generally employed to drive, so as to make the display area of the organic electroluminescent display panel present alternately dark and bright stripes which scroll down continuously the displayed pictures move down continuously).

However, in the signal timing of the organic electroluminescent display panel, in addition to the normal display time (corresponding to the display area scanning time) during each frame of scanning time, a period of time is further set as the front-back porch time during which the drive circuit (IC) is adjusted. When the dimming mode is employed to drive, due to existence of the front-back porch time, spanning of the clock signal cycle occurs easily at the time of switching between the front-back porch time and the display area scanning time, resulting in the timing disorder of the generated drive signal, which causes the problem of the unevenly bright and dark display.

BRIEF SUMMARY

Embodiments of the disclosure provide an organic electroluminescent display panel, a driving method thereof and a display device so as to solve the problem of bright and dark mura of the display pictures due to the front-back porch time in the dimming mode in the prior art.

Thus, an embodiment of the disclosure provides a driving method of an organic electroluminescent display panel, which includes: controlling a light emitting drive circuit to provide a light emitting control signal with a set light emitting cycle during each frame of scanning time; dividing the each frame of scanning time into display area scanning time M and front-back porch time N; and scanning each line of pixel circuits located in a display area of the organic electroluminescent display panel during the display area scanning time. Where the display area scanning time M and the front-back porch time N satisfy the following conditions: M>N and N=k*A; k is an integer greater than or equal to zero, A is a least common multiple of respective clock signal cycles in a gate drive circuit of the organic electroluminescent display panel, and the gate drive circuit includes a scanning drive circuit and the light emitting drive circuit.

In a possible implementation, in the above-mentioned driving method of the organic electroluminescent display panel provided by the embodiment of the disclosure, $1 \leq k \leq 0.01 M/A$.

In a possible implementation, in the above-mentioned driving method of the organic electroluminescent display panel provided by the embodiment of the disclosure, $1 \leq k \leq 0.05a*M/A$; where a is a duty ratio of an effective light emitting signal within the cycle of the light emitting control signal.

In a possible implementation, in the above-mentioned driving method of the organic electroluminescent display panel provided by the embodiment of the disclosure, $a=0.5$.

In a possible implementation, in the above-mentioned driving method of the organic electroluminescent display panel provided by the embodiment of the disclosure, $k=b*M/((n-b)*A)$; and b is a positive integer and n is the number of the light emitting cycles.

In a possible implementation, in the above-mentioned driving method of the organic electroluminescent display panel provided by the embodiment of the disclosure, $b/n \leq 0.2$.

In a possible implementation, in the above-mentioned driving method of the organic electroluminescent display panel provided by the embodiment of the disclosure, $k=M/((n-1)*A)$.

In a possible implementation, in the above-mentioned driving method of the organic electroluminescent display panel provided by the embodiment of the disclosure, $n \geq 5$.

In a possible implementation, in the above-mentioned driving method of the organic electroluminescent display panel provided by the embodiment of the disclosure, $k=0$.

In a possible implementation, in the above-mentioned driving method of the organic electroluminescent display panel provided by the embodiment of the disclosure, $A=4H$, where H is time during which the scanning drive circuit scans a line of pixels.

In another aspect, an embodiment of the disclosure further provides an organic electroluminescent display panel, which includes: pixel circuits arranged in an array and located in a display area, and a gate drive circuit located in a non-display area; where the gate drive circuit includes a scanning drive circuit and a light emitting drive circuit. The light emitting drive circuit is configured to provide a light emitting control signal with a set light emitting cycle during each frame of scanning time; where the each frame of scanning time is divided into display area scanning time M and front-back porch time N. The scanning drive circuit is configured to scan each line of the pixel circuits during the display area scanning time. The display area scanning time M and the front-back porch time N satisfy the following conditions: M>N and N=k*A; k is an integer greater than or equal to zero, and A is a least common multiple of respective clock signal cycles in the gate drive circuit.

In a possible implementation, in the above-mentioned organic electroluminescent display panel provided by the embodiment of the disclosure, $1 \leq k \leq 0.01 M/A$.

In a possible implementation, in the above-mentioned organic electroluminescent display panel provided by the embodiment of the disclosure, $1 \leq k \leq 0.05a*M/A$; where a is a duty ratio of an effective light emitting signal within the cycle of the light emitting control signal.

In a possible implementation, in the above-mentioned organic electroluminescent display panel provided by the embodiment of the disclosure, $a=0.5$.

In a possible implementation, in the above-mentioned organic electroluminescent display panel provided by the embodiment of the disclosure, $k=b*M/((n-b)*A)$; where b is a positive integer and n is the number of the light emitting cycles.

In a possible implementation, in the above-mentioned organic electroluminescent display panel provided by the embodiment of the disclosure, $b/n \leq 0.2$.

In a possible implementation, in the above-mentioned organic electroluminescent display panel provided by the embodiment of the disclosure, $k=M/((n-1)*A)$.

In a possible implementation, in the above-mentioned organic electroluminescent display panel provided by the embodiment of the disclosure, $n \geq 5$;

In a possible implementation, in the above-mentioned organic electroluminescent display panel provided by the embodiment of the disclosure, $k=0$.

In a possible implementation, in the above-mentioned organic electroluminescent display panel provided by the embodiment of the disclosure, $A=4H$, where H is time during which the scanning drive circuit scans a line of pixels.

In another aspect, an embodiment of the disclosure further provides a display device, where the display device includes the above-mentioned organic electroluminescent display panel provided by the embodiment of the disclosure.

An organic electroluminescent display panel, a driving method thereof and a display device provided by the embodiments of the disclosure achieve taking the dimming mode to drive in the organic electroluminescent display panel by means of controlling the light emitting drive circuit to provide the light emitting control signal with the set light emitting cycle during each frame of scanning time, in order to eliminate the ghosting and speed up the response time. Each frame of scanning time is divided into the display area scanning time and the front-back porch time; where each line of pixel circuits located in the display area of the organic electroluminescent display panel are scanned during the display area scanning time; and the drive circuit is adjusted during the front-back porch time. By controlling the front-back porch time and in the case of ensuring that the front-back porch time is less than the display area scanning time, the front-back porch time is ensured to be the common multiple of the respective clock signal cycles in the gate drive circuit of the organic electroluminescent display panel, so that there is no spanning of the clock signal cycle at the time of switching between the front-back porch time and the display area scanning time to ensure the integrity of the clock signal cycle in different periods of time, thereby avoiding the problem of the unevenly bright and dark display caused by the timing disorder of the generated signal due to the non-integrity of the clock signal cycle in different periods of time.

DETAILED DESCRIPTION OF THE EMBODIMENTS

Figure 1A:
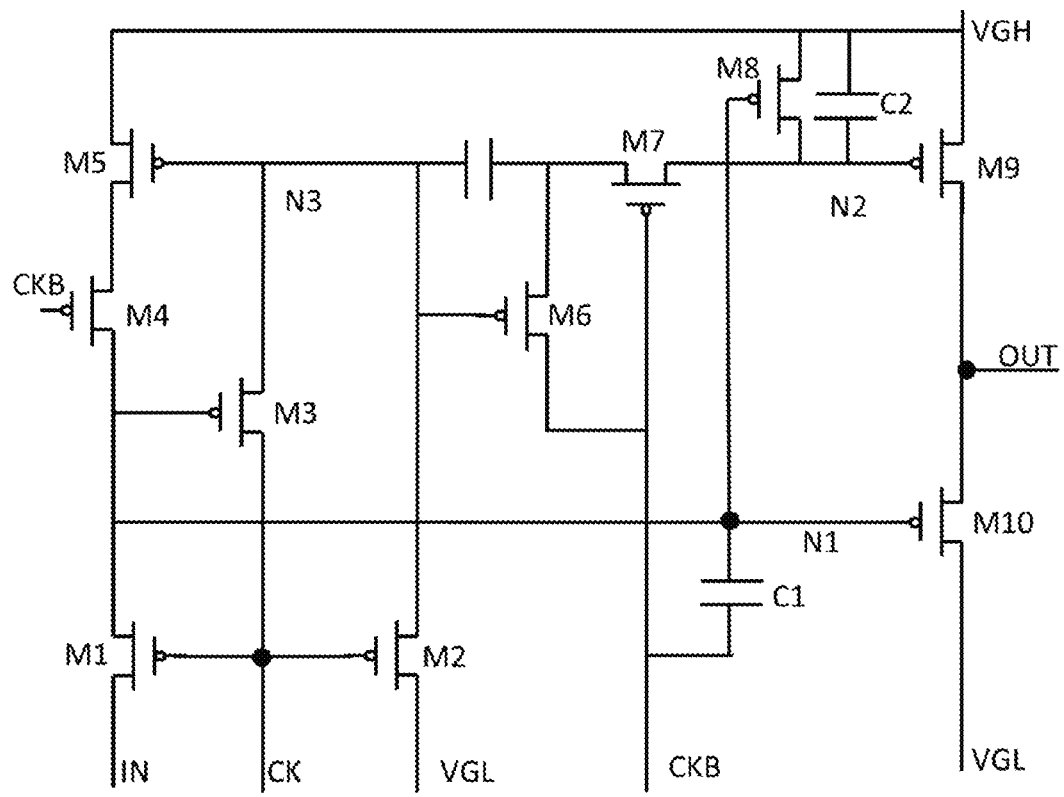
FIG. 1A is a circuit structure diagram of a light emitting drive circuit used in the driving method of the organic electroluminescent display panel provided by an embodiment of the disclosure.

Against the problem in the prior art that the signal timing disorder occurs easily when the drive circuit is adjusted by using the front-back porch time in the dimming mode, the embodiments of the disclosure provide an organic electroluminescent display panel, a driving method thereof and a display device. It should be understood that embodiments described below are only used to illustrate and explain the disclosure but not to limit the disclosure. Also in the case of no conflict, the embodiments and the features therein in the present application can be combined with each other.

In one embodiment, a driving method of an organic electroluminescent display panel provided by an embodiment of the disclosure includes the following operations.

Controlling a light emitting drive circuit to provide a light emitting control signal with a set light emitting cycle during each frame of scanning time; dividing the each frame of scanning time into display area scanning time M and front-back porch time N; where, scanning each line of pixel circuits located in a display area of the organic electroluminescent display panel during the display area scanning time; and the display area scanning time M and the front-back porch time N satisfy the following conditions: $M>N$ and $N=k*A$; k is an integer greater than or equal to zero. A is a least common multiple of respective clock signal cycles in a gate drive circuit of the organic electroluminescent display panel, and the gate drive circuit includes a scanning drive circuit and the light emitting drive circuit.

In one embodiment, in the above-mentioned driving method of the organic electroluminescent display panel provided by the embodiment of the disclosure, it is achieved to take the dimming mode to drive in the organic electroluminescent display panel by means of controlling the light emitting drive circuit to provide the light emitting control signal with the set light emitting cycle during each frame of scanning time, so as to eliminate the ghosting and speed up the response time. Each frame of scanning time is divided into the display area scanning time M and the front-back porch time N; where each line of pixel circuits located in the display area of the organic electroluminescent display panel are scanned during the display area scanning time M; and the drive circuit (IC) is adjusted during the front-back porch time N. By controlling the front-back porch time N and in the case of ensuring that the front-back porch time is less than the display area scanning time M, the front-back porch time N is ensured to be the common multiple of the respective clock signal cycles in the gate drive circuit of the organic electroluminescent display panel, so that there is no spanning of the clock signal cycle at the time of switching between the front-back porch time N and the display area scanning time M to ensure the integrity of the clock signal cycle in different periods of time, thereby avoiding the problem of the unevenly bright and dark display caused by the timing disorder of the generated drive signal due to the non-integrity of the clock signal cycle in different periods of time.

In one embodiment, in the above-mentioned driving method of the organic electroluminescent display panel provided by the embodiment of the disclosure, the display area of the organic electroluminescent display panel in the dimming mode would present alternately dark and bright stripes which scroll down continuously (i.e., the displayed pictures move down continuously), where a bright stripe and an adjacent dark stripe make up one minimum cycle which corresponds to one light emitting cycle of the light emitting control signal. The light emitting control signal provided by the light emitting drive circuit to each pixel circuit has the set light emitting cycle, which means that the light emitting control signal is set to be in the pulse mode; each light emitting cycle includes a high voltage signal portion controlling the pixel circuit not to emit light and a low voltage signal portion controlling the pixel circuit to emit light; and the number of the light emitting cycles of the light emitting control signal is determined by the waveform of the frame start signal inputted to the light emitting drive circuit.

In one implementation, in the above-mentioned driving method of the organic electroluminescent display panel provided by the embodiment of the disclosure, A=4H, where H is time during which the scanning drive circuit scans a line of pixels, that is, the least common multiple of respective clock signal cycles in the gate drive circuit of the organic electroluminescent display panel is generally four times of the time during which the scanning drive circuit scans a line of pixels. Therein the time during which the scanning drive circuit scans a line of pixels refers to the duration of one minimum pulse signal of the frame start signal STV1 inputted to the scanning drive circuit, and under the control of this minimum pulse signal, it can be ensured that the scanning drive signal SCAN outputted by the scanning drive circuit can drive a connected line of pixels to turn on.

Figure 1B:
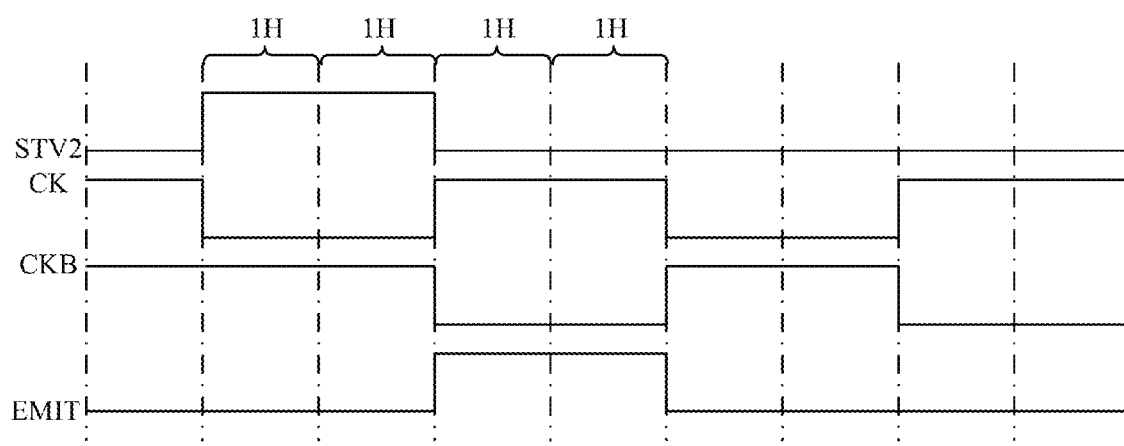
FIG. 1B is a signal timing diagram corresponding to FIG. 1A.
Figure 2A:
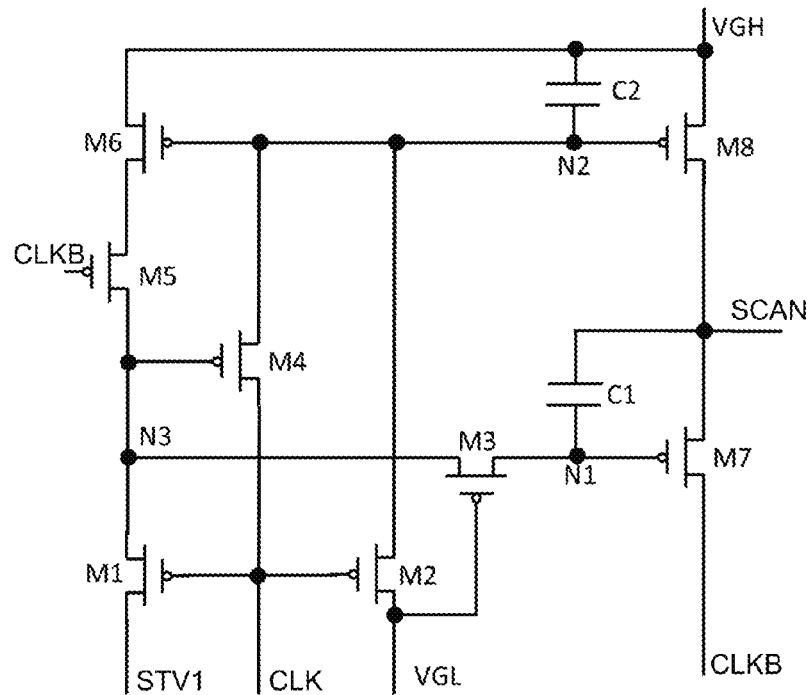
FIG. 2A is a circuit structure diagram of a scanning drive circuit used in the driving method of the organic electroluminescent display panel provided by an embodiment of the disclosure.
Figure 2B:
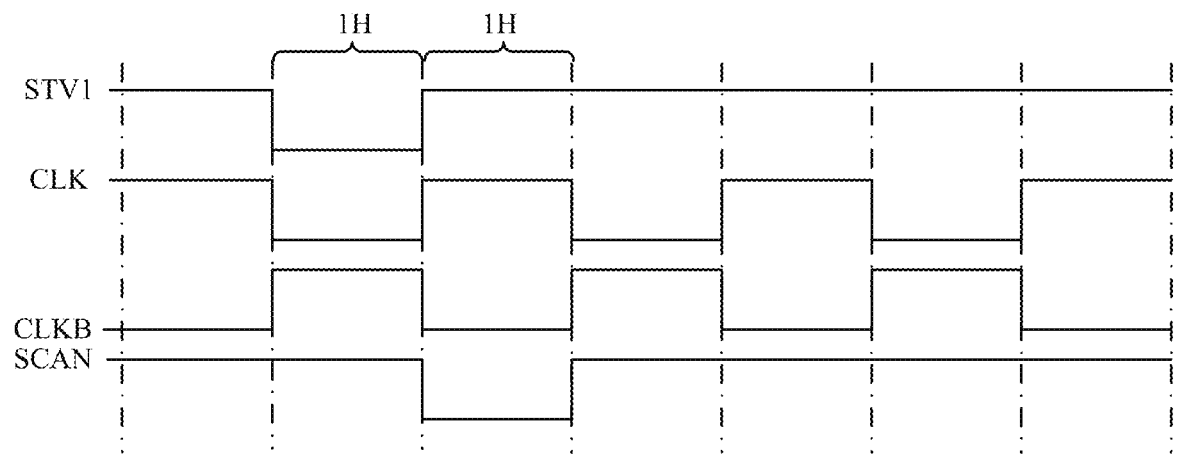
FIG. 2B is a signal timing diagram corresponding to FIG. 2A.

For example, taking a stage of shift registers in the light emitting drive circuit shown in FIG. 1A as an example, the corresponding signal timing diagram is as shown in FIG. 1B, where the light emitting drive circuit has two clock signals CK and CKB, of which the signal waveforms take 4H as one minimum repetition cycle, that is, the clock cycle of the light emitting drive circuit is 4H, where H is the time during which the scanning drive circuit scans a line of pixels. For example, taking a stage of shift registers in the scanning drive circuit shown in FIG. 2A as an example, the corresponding signal timing diagram is as shown in FIG. 2B, where the scanning drive circuit has two clock signals CLK and CLKB, of which the signal waveforms take 2H as one minimum repetition cycle, that is, the clock cycle of the scanning drive circuit is 2H. Then 4H is the least common multiple of the respective clock signal cycles in the gate drive circuit.

Of course in one implementation, the circuit structures of the light emitting drive circuit and the scanning drive circuit are not limited to the structures as shown in FIGS. 1A and 1B, and thus the least common multiple of the respective clock signal cycles in the gate drive circuit made up of the light emitting drive circuit and the scanning drive circuit is not limited to 4H but is generally an even multiple of H, that is, the least common multiple of the respective clock signal cycles in the gate drive circuit is generally an even multiple of the time during which the scanning drive circuit scans a line of pixels.

Figure 3A:
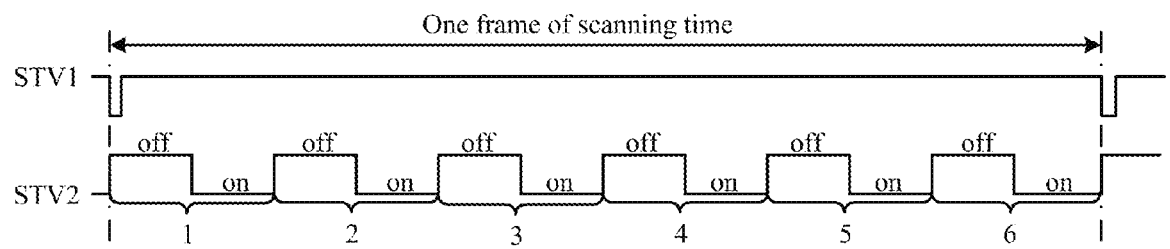
FIG. 3A is a signal timing diagram of a frame start signal in the driving method of the organic electroluminescent display panel provided by an embodiment of the disclosure.
Figure 3B:
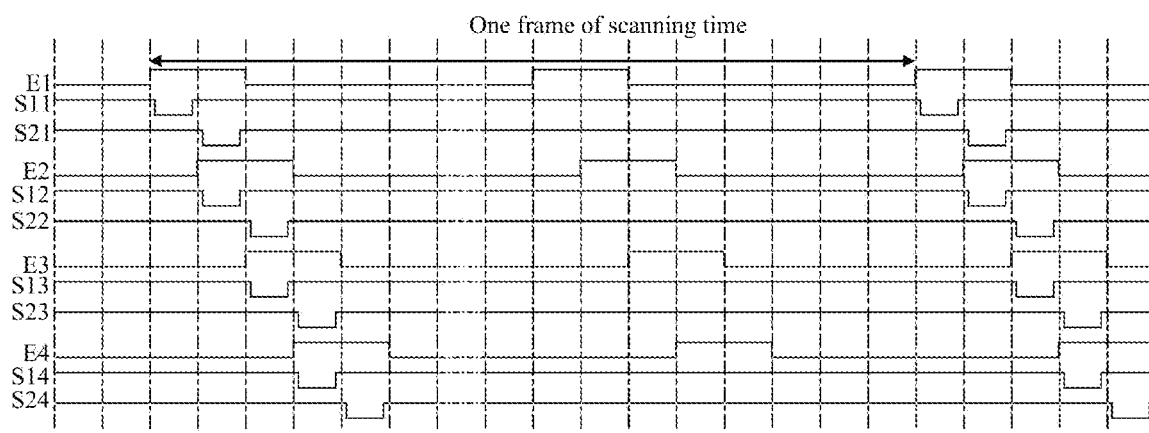
FIG. 3B is a signal timing diagram of the organic electroluminescent display panel in the driving method of the organic electroluminescent display panel provided by an embodiment of the disclosure.
Figure 3C:
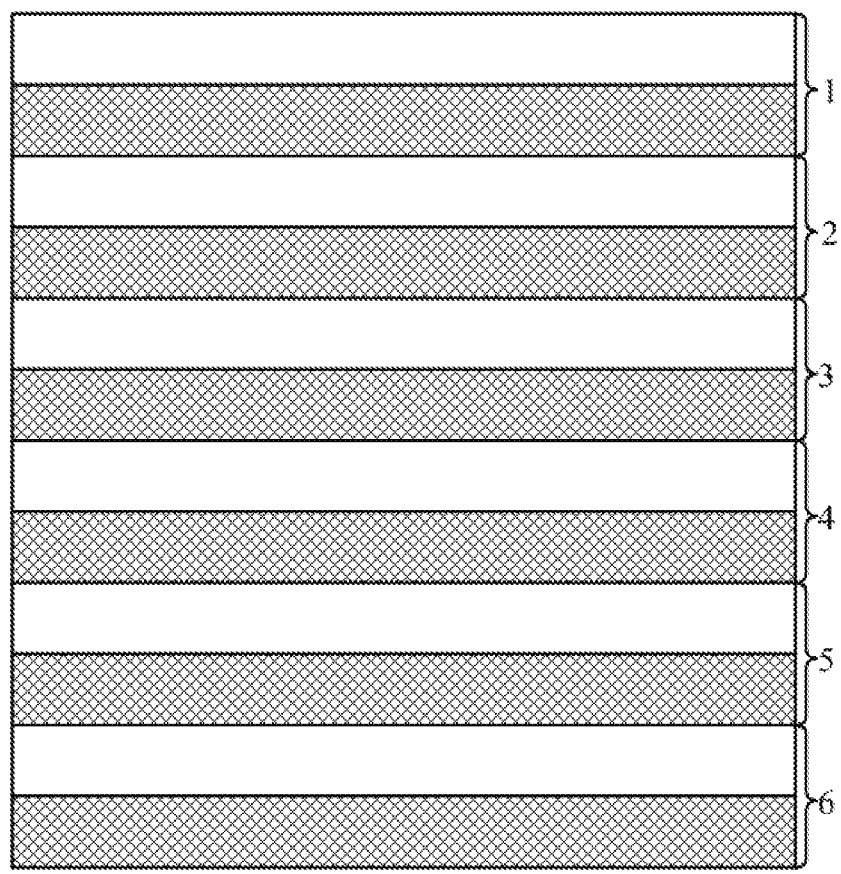
FIGS. 3C and 3D are schematic diagrams of the organic electroluminescent display panel at different moments after employing the dimming mode, respectively.
Figure 3D:
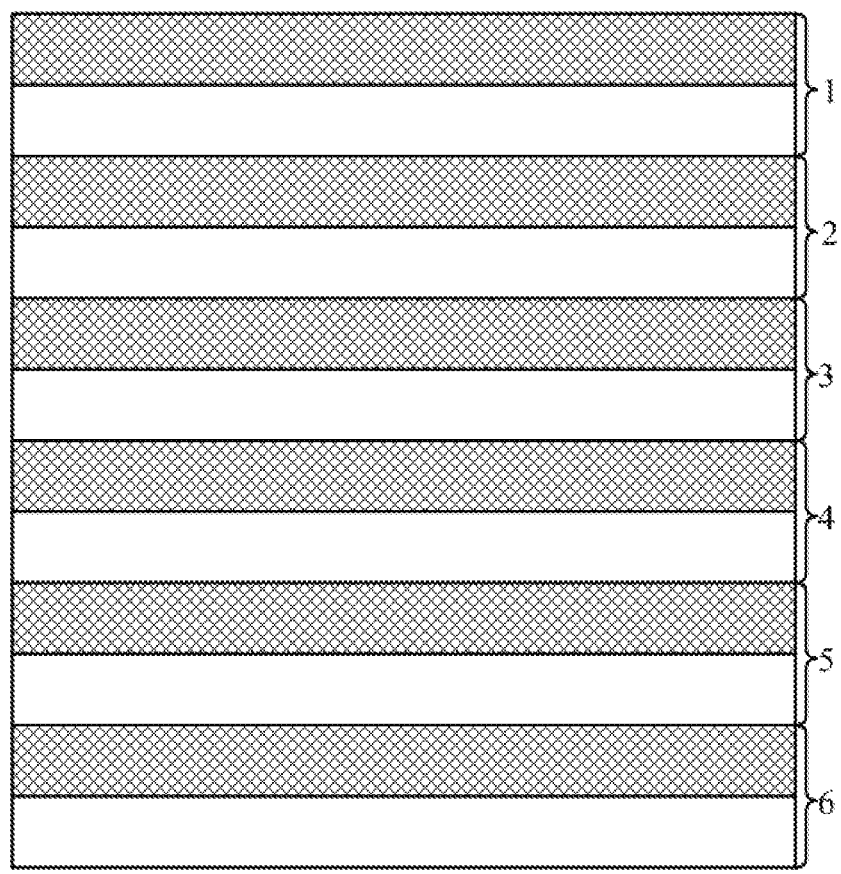

In one implementation, in the dimming mode of the organic electroluminescent display panel, and in the signal timing diagram of the frame start signal provided to the gate drive circuit as shown in FIG. 3A, during each frame of scanning time, a first frame start signal STV1 provided to the scanning drive circuit (SCAN) in the gate drive circuit is not changed, and a second frame start signal STV2 provided to the light emitting drive circuit (EMIT) in the gate drive circuit is set to be in the pulse mode, that is, the second frame start signal STV2 is composed of a plurality of light emitting cycles, e.g., six light emitting cycles as shown in FIG. 3A. One light emitting cycle is composed of a high voltage signal portion, h, controlling the pixel circuit not to emit light and a low voltage signal portion, l, controlling the pixel circuit to emit light. Thus in the signal timing diagram of the light emitting drive circuit as shown in FIG. 3B, the respective shift registers in the light emitting drive circuit (EMIT) provide the corresponding pixel circuits with light emitting control signals E1, E2, E3 and E4 having the same light emitting cycle as the second frame start signal STV2, so that the pixel circuits emit light periodically under the control of the light emitting control signal during each frame of scanning time. Therefore in the dimming mode, the display area of the organic electroluminescent display panel would present alternately dark and bright stripes which scroll down continuously (i.e., the displayed pictures move down continuously), where a bright stripe and an adjacent dark stripe make up one minimum cycle which corresponds to one light emitting cycle of the second frame start signal STV2. A picture presented on the display area of the organic electroluminescent display panel at a moment is as shown in FIG. 3C, and a picture presented on the display area of the organic electroluminescent display panel at another moment is as shown in FIG. 3C. It can be seen that the number of the minimum cycles appearing in FIGS. 3C and 3D is the same as the number of the light emitting cycles of the second frame start signal STV2.

Taking the organic electroluminescent display panel in FHD (Full High Definition an example, there are the display area scanning time of 1920 lines and also the front-back porch time of 48 lines in each frame of scanning time, that is, one frame of scanning time is totally divided into 1968 lines of scanning time. Assuming that the light emitting control signal is divided into six light emitting cycles described above during one frame of scanning time, and in the moving process of the display picture, if a bright stripe enters the front-back porch time (i.e., a bright picture is shown in the front-back porch time), then the number of the lines where the display area shows the bright picture may reduce, the corresponding current of the display area may decrease, the voltage drop of the high voltage power signal (PVDD) may decrease, and the picture may become brighter; otherwise, if a dark stripe enters the front-back porch time (i.e., a dark picture is shown in the front-back porch time), then the number of the lines where the display area shows the dark picture may reduce, the corresponding current of the display area may increase, the voltage drop of the high voltage power signal (PVDD) may increase, and the picture may become darker.

Figure 4A:
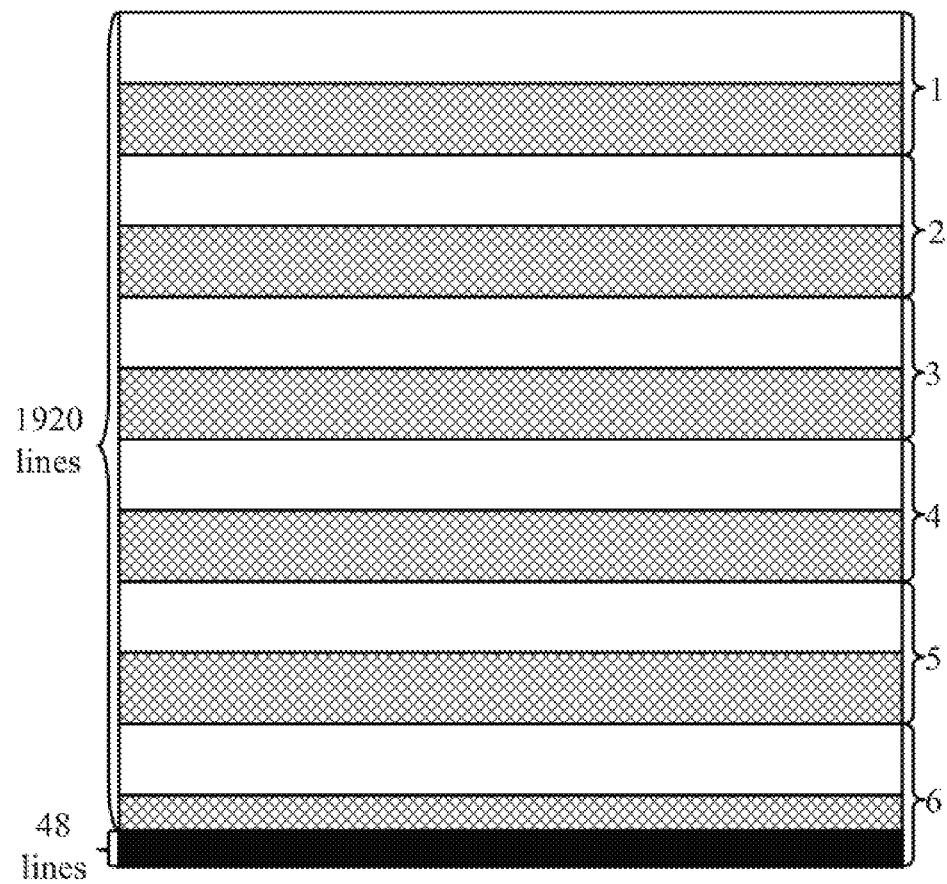
FIGS. 4A to 4D are schematic diagrams of the organic electroluminescent display panel at different moments after employing the dimming mode and adding the front-back porch time, respectively.
Figure 4B:
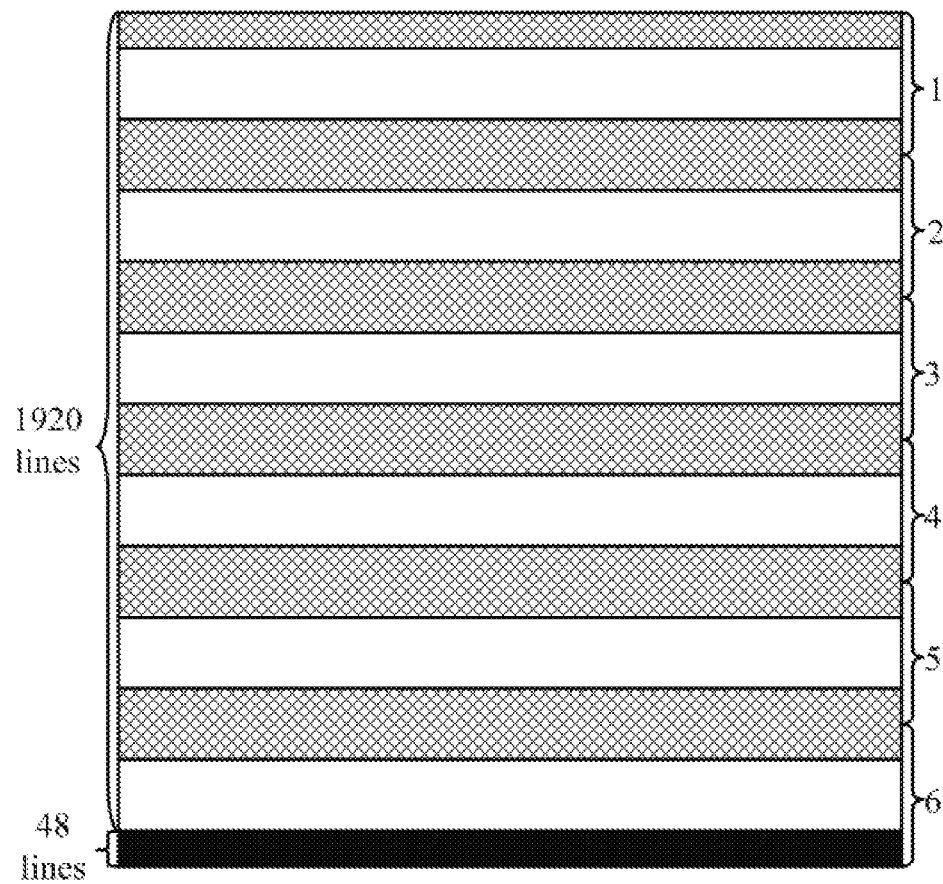
Figure 4C:
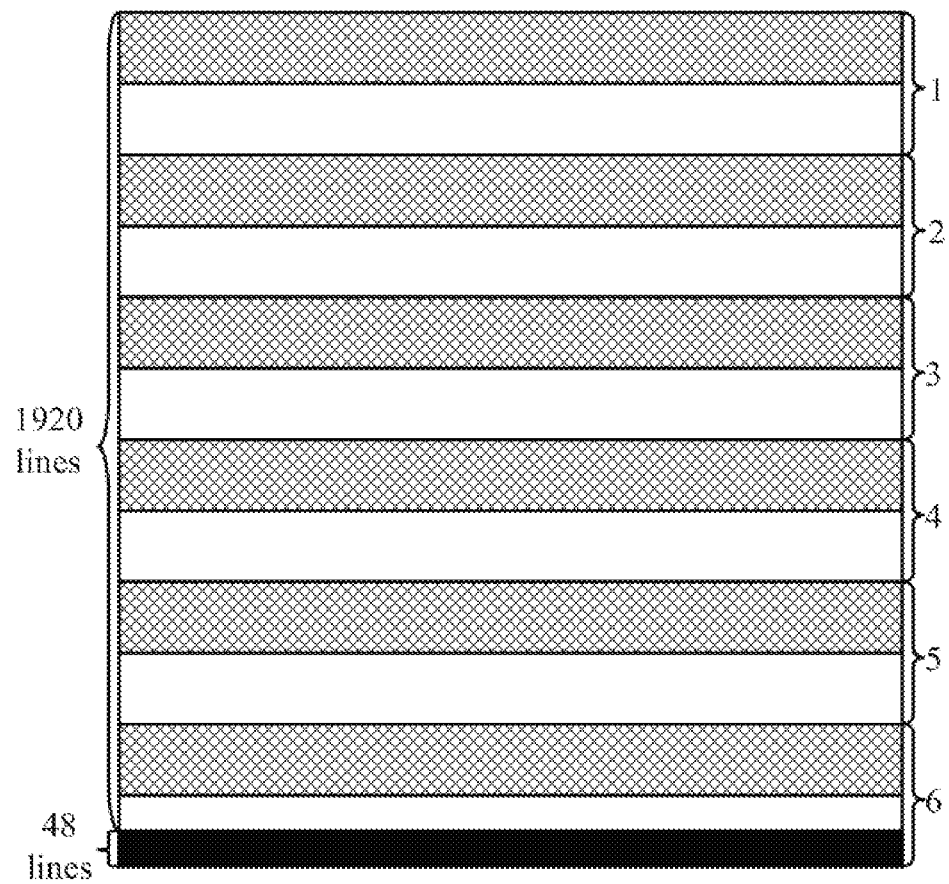
Figure 4D:
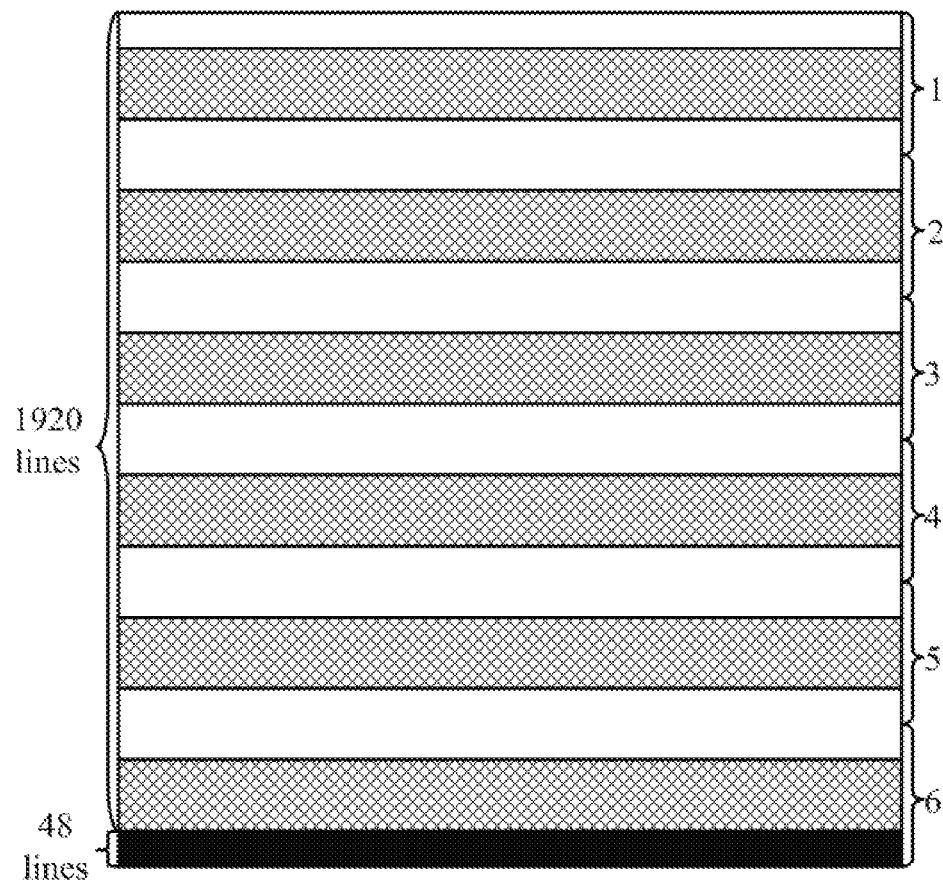

In one embodiment, when the displayed picture moves to the position as shown in FIG. 4A where the dark stripe enters the front-back porch time, there are six bright stripes in the displayed picture and the bright picture appears in totally 328/2*6=984 lines of scanning time. When the displayed picture moves down to the position as shown in FIG. 4B, the number of lines of scanning time of the bright picture in the displayed picture is the same as that in the position as shown in FIG. 4A. When the displayed picture moves down to the position as shown in FIG. 4C, the bright picture appears in totally 984−48=936 lines of scanning time after the sixth bright stripe completely enters the front-back porch time, and the lines of scanning time of the bright picture may begin to decrease. And when the displayed picture moves down to the position as shown in FIG. 4D, the lines of scanning time of the bright picture may keep 936 lines all the time. However the lines of scanning time of the bright picture may begin to increase after the displayed picture loops back to the position as shown in FIG. 4A at next moment. The brightness of the displayed picture in the positions as shown in FIGS. 4a and 4b may be less than the brightness of the displayed picture in the positions as shown in FIGS. 4c and 4d, and thus the bright stripe may be seen in the fixed position.

As can be seen from the above description, the bright and dark stripes entering the front-back porch time are different at different moments which may cause the problem of the bright and dark mura of the display picture in the prior art.

In one implementation, in the above-mentioned driving method of the organic electroluminescent display panel provided by the embodiment of the disclosure, the front-back porch time N can be set in many ways so as to improve the problem of the unevenly bright and dark display picture in the dimming mode, which will be illustrated by several specific embodiments below in details.

First Embodiment

In one implementation, in the above-mentioned driving method of the organic electroluminescent display panel provided by the embodiment of the disclosure, the front-back porch time N can be shortened, that is, the adjustment time of the drive circuit is shortened as much as possible, so that the front-back porch time N does not exceed 1% of the display area scanning time M, thus $1 \leq k \leq 0.01M/A$.

Figure 5A:
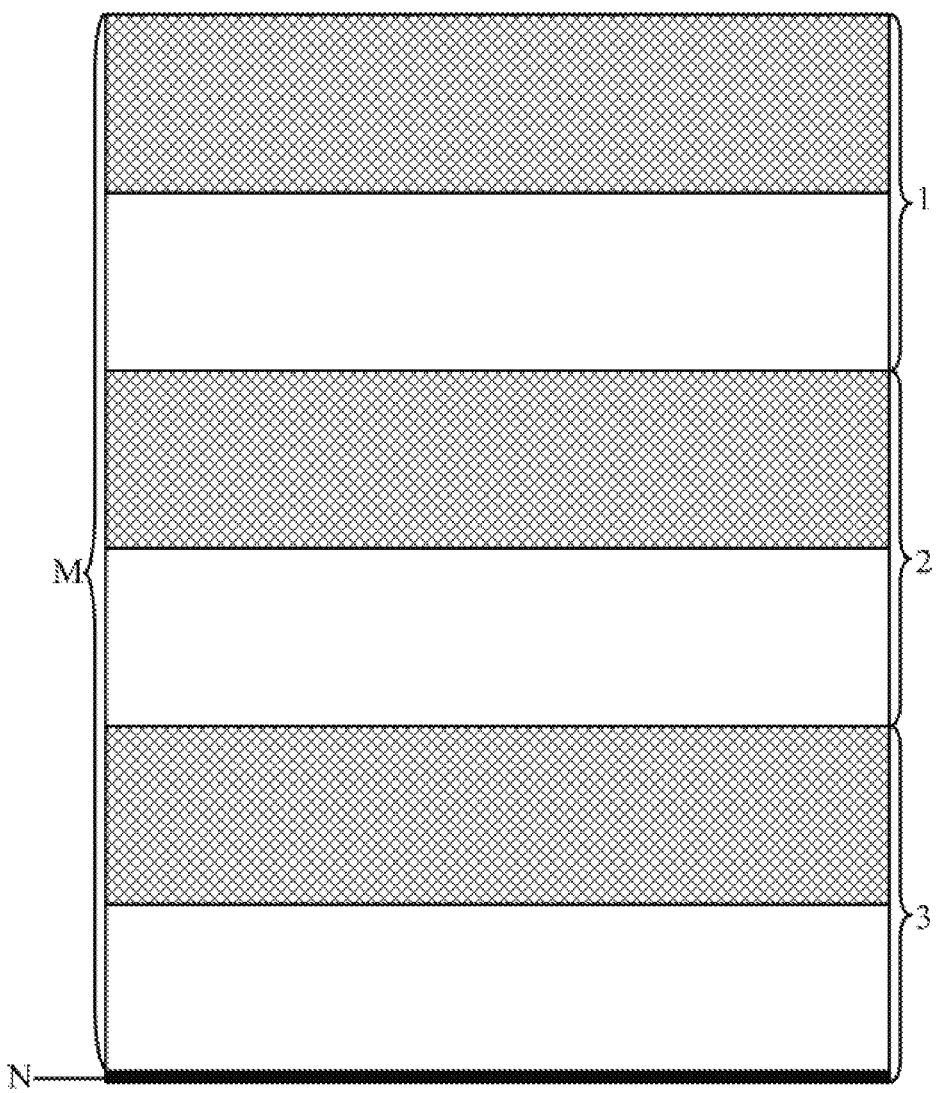
FIGS. 5A and 5B are structural schematic diagrams of a first embodiment in the driving method provided by an embodiment of the disclosure, respectively.
Figure 5B:
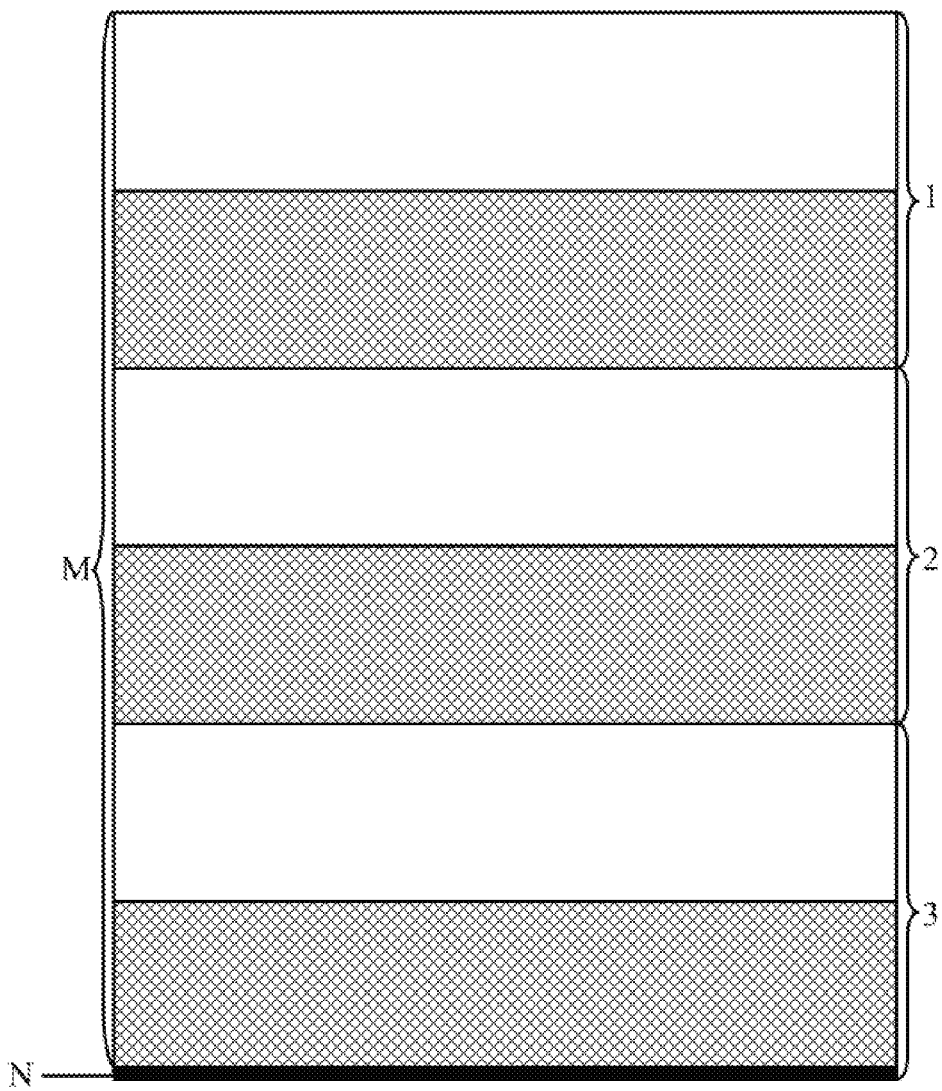

In one embodiment, for the display screen with the resolution of X*Y, X is the total number of lines of the display area, the number of lines in the front-back porch time generally do not exceed 1% of the total number of lines in the corresponding resolution, and $1 \leq k \leq 0.01X/A$, where k is an integer greater than or equal to zero, and A is the least common multiple of respective clock signal cycles in the gate drive circuit of the organic electroluminescent display panel. At this time, there may be some difference between the numbers of the bright and dark lines of the whole display area, but due to the reduced number of lines in the front-back porch time, the front-back porch time N is very short, the voltage drop of the high voltage power signal (PVDD) remains stable relatively, and the display brightness of the screen is relatively uniform. For example, as shown in FIGS. 5A and 5B, the display area scanning time and the front-back porch time contained in each frame of scanning time is totally divided into three light emitting cycles, where one light emitting cycle contains one dark stripe and one bright stripe. As can be seen, since the proportion of the front-back porch time is very small and merely less than 1% of the display area scanning time, only a small part of the bright stripes enter the front-back porch time N as shown in FIG. 5A and only a small part of the dark stripes enter the front-back porch time N as shown in FIG. 5B. Thus the difference in brightness between them is not obvious, and the display brightness of the screen is relatively uniform.

Second Embodiment

In one implementation, the difference in brightness being 1/20 of the total luminescence is considered as a judgement standard in the industry, and the human eyes are insensitive to the difference in brightness which is not more than 1/20 of the total luminescence, that is, the human eyes cannot recognize the difference in brightness which is not more than 1/20 of the total luminescence. Based on this, in the above-mentioned driving method of the organic electroluminescent display panel provided by the embodiment of the disclosure, the front-back porch time N can be set to be not more than 5% of the total scanning time of the light emitting lines, that is, $N/(a*M) \leq 1/20$, thus $1 \leq k \leq 0.05a*M/A$; where a is the duty ratio of an effective light emitting signal within the cycle of the light emitting control signal. If the low voltage signal portion in the light emitting control signal controls the pixel circuit to emit light and the high voltage signal portion controls the pixel circuit not to emit light, then the effective light emitting signal is the low voltage signal portion, and the duty ratio of the effective light emitting signal within the cycle of the light emitting control signal is the low voltage signal portion: (the high voltage signal portion+ the low voltage signal portion). Thus at any moment, the front-back porch time N occupies 1/20 or less of the number of the light emitting lines and may not have evident effects on the current of the whole display panel at this time, and thus no significant bright band mura appears either.

In one implementation, in the above-mentioned organic electroluminescent display panel provided by the embodiment of the disclosure, generally, the duty ratio, a, of the effective light emitting signal within the cycle of the light emitting control signal is 50%, that is, the duration of the high voltage signal portion is equal to the duration of the low voltage signal portion, thus a=0.5.

Third Embodiment

In one implementation, in the above-mentioned driving method of the organic electroluminescent display panel provided by the embodiment of the disclosure, in order to ensure that the number of the pixels in the light emitting state in the display panel is the same at any moment, i.e., ensure that the numbers of lines of the bright and dark stripes of the display area remain stable at any moment, the voltage drop of the high voltage power signal (PVDD) remains stable constantly, making the picture uniform and thus completely eliminating the bright band mura. In one embodiment, the front-back porch time N can be set to a multiple of one light emitting cycle of the light emitting control signal, that is, it is ensured that only b complete light emitting cycles enter the front-back porch time N, i.e., $N*n=(M+N)*b$, then $k=b*M/((n-b)*A)$; where b is a positive integer and n is the number of the light emitting cycles.

Figure 6A:
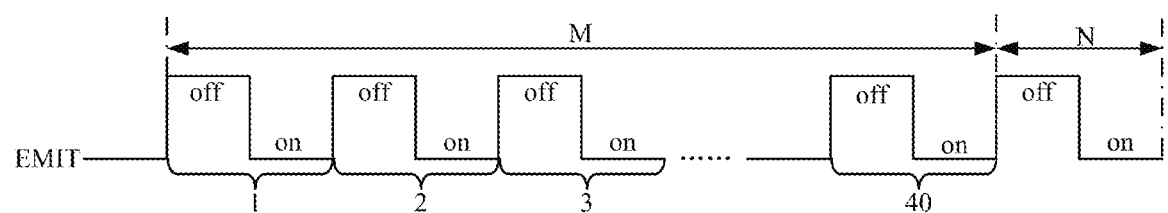
FIGS. 6A and 6B are signal timing diagrams of a third embodiment in the driving method provided by an embodiment of the disclosure, respectively.
Figure 6B:
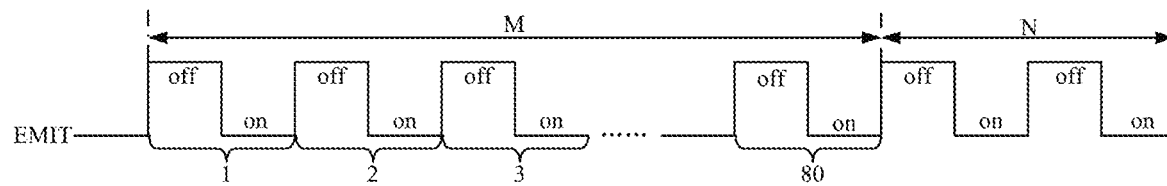

Further in the above-mentioned driving method of the organic electroluminescent display panel provided by the embodiment of the disclosure, in the case of ensuring that only h complete light emitting cycles enter the front-back porch time N, the proportion of the front-back porch time N may be reduced as possible to ensure the sufficient display area scanning time M. Generally the proportion of the front-back porch time N to one frame of scanning time is usually not more than 20%, then $b/n \leq 0.2$. Taking the organic electroluminescent display panel in FHD as an example, the display area scanning time M is 1920 lines and the front-back porch time N is 48 lines; as shown in FIG. 6A, if b=1, then n=41, indicating that there are 41 light emitting cycles in one frame of scanning time, where one light emitting cycle enters the front-back porch time N; and as shown in FIG. 6B, b=2, then n=82, indicating that there are 82 light emitting cycles in one frame of scanning time, where two light emitting cycles enter the front-back porch time N.

Further in the above-mentioned driving method of the organic electroluminescent display panel provided by the embodiment of the disclosure, in the case of ensuring that the proportion of the front-back porch time N to one frame of scanning time is usually not more than 20%, the light emitting cycles entering the front-back porch time N can be reduced as possible. For example, only one light emitting cycle enters the front-back porch time N, then $k=M/((n-1)*A)$.

Figure 6C:
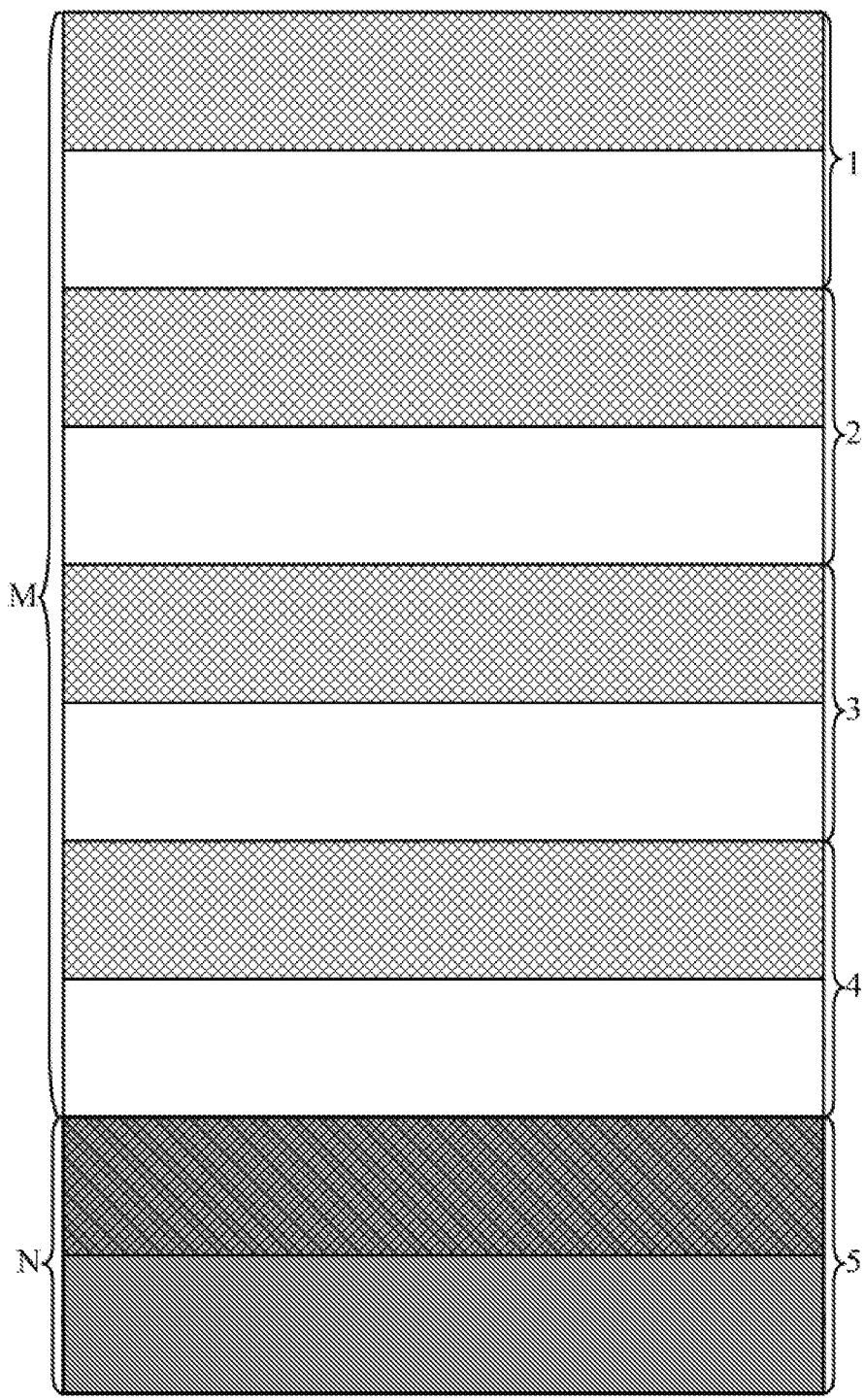
FIG. 6C is a structural schematic diagram of the third embodiment in the driving method provided by an embodiment of the disclosure.

Further in the above-mentioned driving method of the organic electroluminescent display panel provided by the embodiment of the disclosure, in the case of ensuring that the proportion of the front-back porch time N to one frame of scanning time is not more than 20%, the number of the light emitting cycles of the light emitting control signal may need to be at least 5, i.e., $n \geq 5$, when only one light emitting cycle enters the front-back porch time N. As shown in FIG. 6C, one light emitting cycle entering the front-back porch time can be added on the basis of four light emitting cycles within the original display area scanning time. At this time whether a line of dark stripes or bright stripes enter the front-back porch time, a corresponding line of bright stripes or dark stripes may enter the display area. Thus the numbers of the bright and dark lines of the whole display area remain stable, the voltage drop of the high voltage power signal (PVDD) remains stable constantly and the screen display is uniform.

Fourth Embodiment

Figure 7:
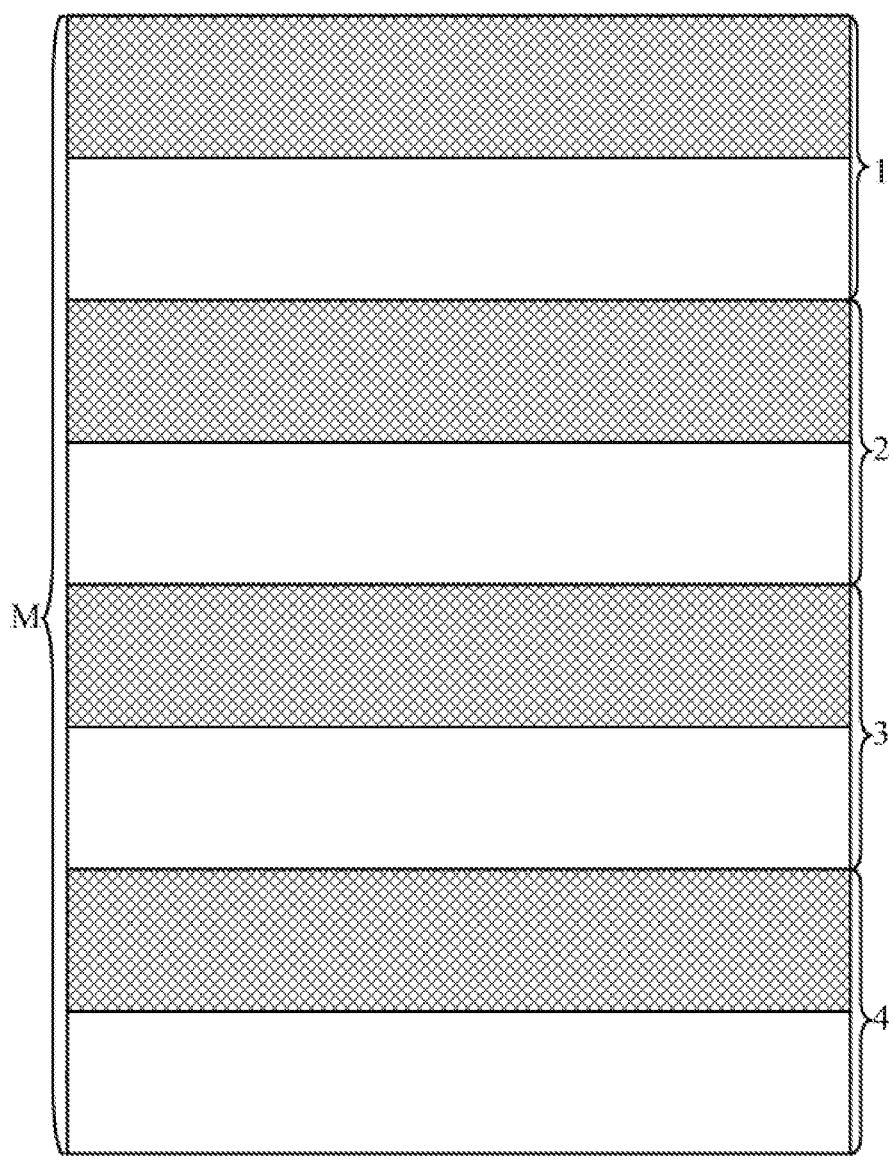
FIG. 7 is a structural schematic diagram of a fourth embodiment in the driving method provided by an embodiment of the disclosure.

In one implementation, in the above-mentioned driving method of the organic electroluminescent display panel provided by the embodiment of the disclosure, it is further possible to let k=0, i.e., cancel the front-back porch time N, as shown in FIG. 7. No matter how many light emitting cycles the whole screen is divided into, the numbers of the bright and dark lines of the whole display area remain stable all the time, the voltage drop of the high voltage power signal (PVDD) remains stable constantly and the screen display is uniform after the front-back porch time N is canceled. This implementation may need a particular drive circuit IC to display cooperatively.

Based upon the same inventive concept, an embodiment of the disclosure further provides an organic electroluminescent display panel. Since the principle solving the problem of this organic electroluminescent display panel is similar to that of the above-mentioned driving method of the organic electroluminescent display panel, the implementations of this organic electroluminescent display panel can refer to the implementations of the method, and the repeated description thereof will be omitted here.

Figure 8:
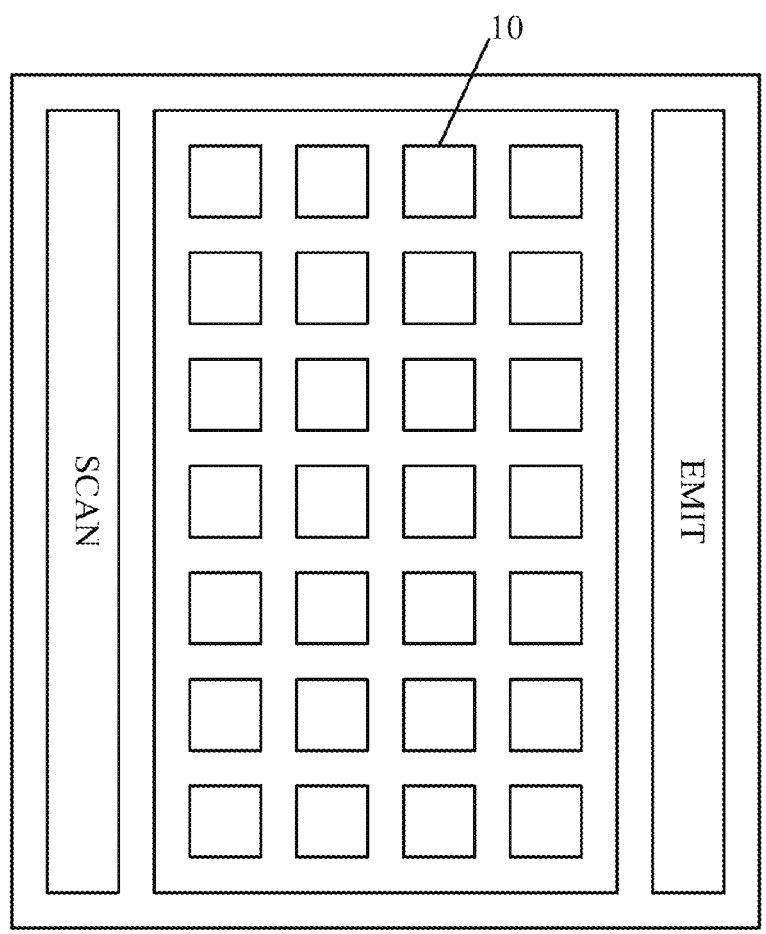
FIG. 8 is a structural schematic diagram of the organic electroluminescent display panel provided by an embodiment of the disclosure.

In one embodiment, an organic electroluminescent display panel provided by the embodiment of the disclosure, as shown in FIG. 8, includes: pixel circuits 10 arranged in an array and located in a display area, and a gate drive circuit located in a non-display area; where the gate drive circuit includes a scanning drive circuit SCAN and a light emitting drive circuit EMIT.

The light emitting drive circuit EMIT is configured to provide a light emitting control signal with a set light emitting cycle during each frame of scanning time; where the each frame of scanning time is divided into display area scanning time M and front-back porch time N.

The scanning drive circuit SCAN is configured to scan each line of the pixel circuits during the display area scanning time.

The display area scanning time M and the front-back porch time N satisfy the following conditions: M>N and N=k*A; k is an integer greater than or equal to zero, and A is a least common multiple of respective clock signal cycles in the gate drive circuit.

In one implementation, in the above-mentioned organic electroluminescent display panel provided by the embodiment of the disclosure, respective shift registers in the light emitting drive circuit EMIT may be electrically connected with two corresponding lines of pixel circuits to control the light emitting condition of the two lines of pixel circuits simultaneously. The shift registers of the light emitting drive circuit EMIT may use the circuit structure as shown in FIG. 1A, but also may use other circuit structures. There is no limit on this.

In one implementation, in the above-mentioned organic electroluminescent display panel provided by the embodiment of the disclosure, respective shift registers in the scanning drive circuit SCAN may be electrically connected with one corresponding line of pixel circuits to control line-by-line scanning of the pixel circuits. The shift registers in the scanning drive circuit SCAN may use the circuit structure as shown in FIG. 2A, but also can use other circuit structures. There is no limit on this.

In one implementation, in the above-mentioned organic electroluminescent display panel provided by the embodiment of the disclosure, $1 \leq k \leq 0.01 M/A$.

In one implementation, in the above-mentioned organic electroluminescent display panel provided by the embodiment of the disclosure, $1 \leq k \leq 0.05a*M/A$; where a is a duty ratio of an effective light emitting signal within the cycle of the light emitting control signal.

In one implementation, in the above-mentioned organic electroluminescent display panel provided by the embodiment of the disclosure, a=0.5.

In one implementation, in the above-mentioned organic electroluminescent display panel provided by the embodiment of the disclosure, $k=b*M/((n-b)*A)$; where b is a positive integer and n is the number of the light emitting cycles.

In one implementation, in the above-mentioned organic electroluminescent display panel provided by the embodiment of the disclosure, $b/n \leq 0.2$.

In one implementation, in the above-mentioned organic electroluminescent display panel provided by the embodiment of the disclosure, $k=M/((n-1)*A)$.

In one implementation, in the above-mentioned organic electroluminescent display panel provided by the embodiment of the disclosure, $n \geq 5$.

In one implementation, in the above-mentioned organic electroluminescent display panel provided by the embodiment of the disclosure, k=0.

In one implementation, in the above-mentioned organic electroluminescent display panel provided by the embodiment of the disclosure, A=4H, where H is time during which the scanning drive circuit scans a line of pixels.

Figure 9:
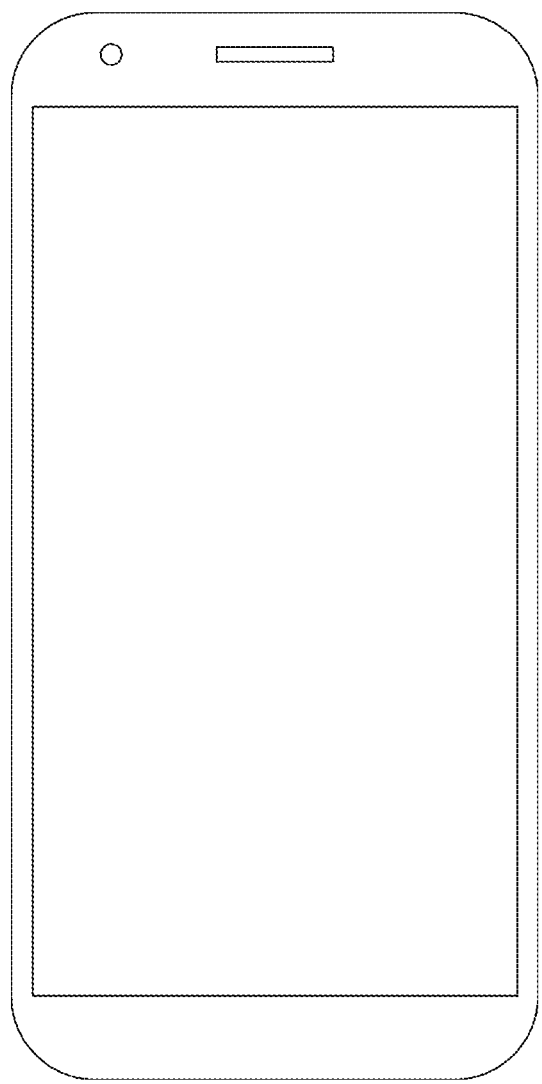
FIG. 9 is a structural schematic diagram of the display device provided by an embodiment of the disclosure.

Based upon the same inventive concept, an embodiment of the disclosure further provides a display device, as shown in FIG. 9, which includes the above-mentioned organic electroluminescent display panel provided by the embodiment of the disclosure. The display device may be a mobile phone, a tablet, a television, a display, a laptop, a digital photo frame, a navigator, or any other product or component with display functions. All of other indispensable components of this display device should be understood by those ordinary skilled in the art to be included, and will be omitted here and should not be considered as limitations on the disclosure. The implementations of this display device can refer to the embodiments of the above-mentioned organic electroluminescent display panel, and the repeated description thereof will be omitted here.

The above-mentioned organic electroluminescent display panel, driving method thereof and display device provided by the embodiments of the disclosure achieve taking the dimming mode to drive in the organic electroluminescent display panel by means of controlling the light emitting drive circuit to provide the light emitting control signal with the set light emitting cycle during each frame of scanning time, in order to eliminate the ghosting and speed up the response time. Each frame of scanning time is divided into the display area scanning time and the front-back porch time; where each line of pixel circuits located in the display area of the organic electroluminescent display panel are scanned during the display area scanning time; and the drive circuit is adjusted during the front-back porch time. By controlling the front-back porch time and in the case of ensuring that the front-back porch time is less than the display area scanning time, the front-back porch time is ensured to be the common multiple of the respective clock signal cycles in the gate drive circuit of the organic electroluminescent display panel, so that there is no spanning of the clock signal cycle at the time of switching between the front-back porch time and the display area scanning time to ensure the integrity of the clock signal cycle in different periods of time, thereby avoiding the problem of the unevenly bright and dark display caused by the timing disorder of the generated drive signal due to the non-integrity of the clock signal cycle in different periods of time.

Evidently those skilled in the art can make various modifications and variations to the disclosure without departing from the spirit and scope of the disclosure. Thus the disclosure is also intended to encompass these modifications and variations therein as long as these modifications and variations come into the scope of the claims of the disclosure and their equivalents.

What is claimed is:

1. A driving method of an organic electroluminescent display panel, comprising:
   controlling a light emitting drive circuit to provide a light emitting control signal with a set light emitting cycle during each frame of scanning time;
   dividing the each frame of scanning time into display area scanning time M and front-back porch time N; and
   scanning each line of pixel circuits located in a display area of the organic electroluminescent display panel during the display area scanning time; wherein
   the display area scanning time M and the front-back porch time N satisfy following conditions:
   M>N and N=k*A; k is an integer greater than zero, A is a least common multiple of respective clock signal cycles in a gate drive circuit of the organic electroluminescent display panel, and the gate drive circuit comprises a scanning drive circuit and the light emitting drive circuit;
   wherein k=b*M/((n-b)*A); wherein b is a positive integer and n is the number of the light emitting cycles;
   wherein b/n≤0.2.

2. The driving method of the organic electroluminescent display panel of claim 1, wherein 1≤k≤0.01M/A.

3. The driving method of the organic electroluminescent display panel of claim 1, wherein 1≤k≤0.05a*M/A; wherein a is a duty ratio of an effective light emitting signal within the cycle of the light emitting control signal.

4. The driving method of the organic electroluminescent display panel of claim 3, wherein a=0.5.

5. The driving method of the organic electroluminescent display panel of claim 1, wherein k=M/((n-1)*A).

6. The driving method of the organic electroluminescent display panel of claim 5, wherein n≥5.

7. The driving method of the organic electroluminescent display panel of claim 1, wherein k=0.

8. The driving method of the organic electroluminescent display panel of claim 1, wherein A=4H, and H is time during which the scanning drive circuit scans a line of pixels.

9. An organic electroluminescent display panel, comprising:
   pixel circuits arranged in an array and located in a display area, and a gate drive circuit located in a non-display area; wherein the gate drive circuit comprises a scanning drive circuit and a light emitting drive circuit;
   the light emitting drive circuit is configured to provide a light emitting control signal with a set light emitting cycle during each frame of scanning time; wherein the each frame of scanning time is divided into display area scanning time M and front-back porch time N;
   the scanning drive circuit is configured to scan each line of the pixel circuits during the display area scanning time; and
   the display area scanning time M and the front-back porch time N satisfy following conditions:
   M>N and N=k*A; k is an integer greater than zero, and A is a least common multiple of respective clock signal cycles in the gate drive circuit;
   wherein k=b*M/((n-b)*A); wherein b is a positive integer and n is the number of the light emitting cycles;
   wherein b/n≤0.2.

10. The organic electroluminescent display panel of claim 9, wherein 1≤k≤0.01M/A.

11. The organic electroluminescent display panel of claim 9, wherein 1≤k≤0.05a*M/A; wherein a is a duty ratio of an effective light emitting signal within the cycle of the light emitting control signal.

12. The organic electroluminescent display panel of claim 11, wherein a=0.5.

13. The organic electroluminescent display panel of claim 9, wherein k=M/((n-1)*A).

14. The organic electroluminescent display panel of claim 13, wherein n≥5.

15. The organic electroluminescent display panel of claim 9, wherein k=0.

16. The organic electroluminescent display panel of claim 9, wherein A=4H, and H is time during which the scanning drive circuit scans a line of pixels.

17. A display device, comprising:
an organic electroluminescent display panel, wherein the organic electroluminescent display panel comprises: pixel circuits arranged in an array and located in a display area, and a gate drive circuit located in a non-display area; wherein the gate drive circuit comprises a scanning drive circuit and a light emitting drive circuit;
the light emitting drive circuit is configured to provide a light emitting control signal with a set light emitting cycle during each frame of scanning time; wherein the each frame of scanning time is divided into display area scanning time M and front-back porch time N;
the scanning drive circuit is configured to scan each line of the pixel circuits during the display area scanning time; and
the display area scanning time M and the front-back porch time N satisfy following conditions:
M>N and N=k*A; k is an integer greater than zero, and A is a least common multiple of respective clock signal cycles in the gate drive circuit;
wherein k=b*M/((n-b)*A); wherein b is a positive integer and n is the number of the light emitting cycles;
wherein b/n≤0.2.

* * * * *